(12) United States Patent
Mueller et al.

(10) Patent No.: US 8,294,991 B2
(45) Date of Patent: Oct. 23, 2012

(54) INTERFERENCE SYSTEMS FOR MICROLITHGRAPHIC PROJECTION EXPOSURE SYSTEMS

(75) Inventors: Ralf Mueller, Aalen (DE); Toralf Gruner, Aalen-Hofen (DE); Michael Totzeck, Schwaebisch Gmuend (DE); Heiko Feldmann, Aalen (DE); Hans-Jochen Paul, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 214 days.

(21) Appl. No.: 12/687,299

(22) Filed: Jan. 14, 2010

(65) Prior Publication Data

US 2010/0134891 A1    Jun. 3, 2010

Related U.S. Application Data

(63) Continuation of application No. PCT/EP2008/059435, filed on Jul. 18, 2008.

(60) Provisional application No. 60/951,294, filed on Jul. 23, 2007.

(30) Foreign Application Priority Data

Jul. 23, 2007  (DE) .......................... 10 2007 034 641

(51) Int. Cl.
*G02B 27/00*  (2006.01)

(52) U.S. Cl. .......................... 359/578; 359/580; 355/71

(58) Field of Classification Search .................. None
See application file for complete search history.

(56) References Cited

U.S. PATENT DOCUMENTS

| | | | | |
|---|---|---|---|---|
| 4,991,962 | A * | 2/1991 | Jain ................................. | 356/490 |
| 4,998,017 | A * | 3/1991 | Ryan et al. ...................... | 250/343 |
| 5,754,343 | A * | 5/1998 | Arnold et al. ................... | 359/578 |
| 5,818,988 | A | 10/1998 | Modavis | |
| 6,590,710 | B2 | 7/2003 | Hara et al. | |
| 7,016,096 | B2 * | 3/2006 | Izumi et al. .................... | 359/280 |
| 7,131,740 | B2 | 11/2006 | Nishioka | |
| 7,518,797 | B2 | 4/2009 | Pazidis et al. | |
| 7,782,440 | B2 | 8/2010 | Beierl et al. | |
| 7,830,611 | B2 | 11/2010 | Conradi et al. | |
| 2001/0015810 | A1 * | 8/2001 | Hara et al. ..................... | 356/519 |
| 2002/0027716 | A1 | 3/2002 | Tanaka | |

(Continued)

FOREIGN PATENT DOCUMENTS

DE    40 03 841    8/1991

(Continued)

OTHER PUBLICATIONS

Naumann et al., "Bauelemente der Optik; 5., überarbeitete und ergänzte," Carl Hanser Verlag Munich, Vienna 1987, pp. 259-263, with English translation (11 pages).

(Continued)

*Primary Examiner* — Arnel C Lavarias
(74) *Attorney, Agent, or Firm* — Fish & Richardson P.C.

(57) ABSTRACT

An optical system of a microlithographic projection exposure apparatus permits comparatively flexible and fast influencing of the intensity distribution and/or the polarization state. The optical system includes at least one layer system that is at least one-side bounded by a lens or a mirror. The layer system is an interference layer system of several layers and has at least one liquid or gaseous layer portion with a maximum thickness of one micrometer (μm), and a manipulator for manipulation of the thickness profile of the layer portion.

24 Claims, 8 Drawing Sheets

U.S. PATENT DOCUMENTS

| | | |
|---|---|---|
| 2004/0051856 A1 | 3/2004 | Bleeker et al. |
| 2006/0221456 A1 | 10/2006 | Shafer et al. |
| 2006/0256447 A1 | 11/2006 | Dodoc |
| 2007/0115415 A1 | 5/2007 | Piehl et al. |
| 2007/0121468 A1 | 5/2007 | Koyama et al. |
| 2007/0242358 A1* | 10/2007 | Lin et al. .................. 359/578 |
| 2008/0094599 A1 | 4/2008 | Scheible et al. |

FOREIGN PATENT DOCUMENTS

| | | |
|---|---|---|
| JP | 2002-174721 | 6/2002 |
| JP | 2005-106855 | 4/2005 |
| JP | 2006-053275 | 2/2006 |
| JP | 2006-106329 | 4/2006 |
| JP | 2007-156485 | 6/2007 |
| JP | 2008-502127 | 1/2008 |
| JP | 2008-521224 | 6/2008 |
| JP | 2009-503826 | 1/2009 |
| WO | WO 98/14804 | 4/1998 |
| WO | WO 2004/019128 | 3/2004 |
| WO | WO 2005/069055 | 7/2005 |
| WO | WO 2005/119369 | 12/2005 |
| WO | WO 2007/017089 | 2/2007 |

OTHER PUBLICATIONS

Japanese Office Action, with English translation, for corresponding JP Appl No. 2010-515534, dated Feb. 6, 2012.

* cited by examiner

INTERFERENCE SYSTEMS FOR MICROLITHGRAPHIC PROJECTION EXPOSURE SYSTEMS

CROSS-REFERENCE TO RELATED APPLICATIONS

This application is a continuation of, and claims benefit under 35 USC 120 to, international application PCT/EP2008/059435, filed Jul. 18, 2008, which claims benefit of German Application No. 10 2007 034 641.9, filed Jul. 23, 2007 and U.S. Ser. No. 60/951,294, filed Jul. 23, 2007. International application PCT/EP2008/059435 is hereby incorporated by reference in its entirety.

FIELD OF THE DISCLOSURE

The disclosure concerns an optical system of a microlithographic projection exposure apparatus.

BACKGROUND

Microlithography is used for the production of microstructured components such as for example integrated circuits or LCDs. The microlithography process is carried out in what is referred to as a projection exposure apparatus having an illumination system and a projection objective. The image of a mask (=reticle) illuminated via the illumination system is projected via the projection objective onto a substrate (for example a silicon wafer) which is coated with a light-sensitive layer (for example photoresist) and arranged in the image plane of the projection objective in order to transfer the mask structure onto the light-sensitive coating on the substrate.

In some instances, in the illumination system and also in the projection objective, a desired intensity distribution and/or an initially set polarization state can be altered in an unwanted fashion. The influences which are responsible for that include in particular birefringence effects which are variable in respect of time such as what is referred to as polarization-induced birefringence (PIB), compacting in non-crystalline material (for example quartz glass) of optical components, degradation phenomena and thermal effects as well as birefringence which is present in anti-reflecting or highly reflecting layers on the optical components as a consequence of form birefringence or by virtue of different Fresnel reflection and transmission for orthogonal polarization states.

SUMMARY

In some embodiments, the disclosure provides an optical system of a microlithographic projection exposure apparatus that permits comparatively flexible and fast influencing of the intensity distribution and/or the polarization state.

In certain embodiments, the disclosure provides an optical system of a microlithographic projection exposure apparatus that includes at least one layer system which is at least one-side bounded by a lens or a mirror, wherein the layer system is an interference layer system of several layers and has at least one liquid or gaseous layer portion whose maximum thickness is at a maximum 1 micrometer ($\mu$m), and a manipulator for manipulation of the thickness profile of the layer portion.

The effect achieved by the layer system with a liquid or gaseous layer portion of a maximum thickness of a maximum of 1 micrometer ($\mu$m) is to be distinguished from the action achieved in accordance with the state of the art (for example in the case of a liquid lens) of a refractive optical element. While, in the latter case, the refractive power which influences the beam path and which is dependent on the form of the refractive lens is altered the concept of the disclosure provides that the beam path as such is not influenced in a first approximation but—in a fundamentally different form of action—it can involve influencing for example phase separation by interference effects which occur between the partial waves of the light components partially reflected a plurality of times in the layer system.

In other words, in accordance with the disclosure—unlike for example a liquid lens with a liquid layer of typically a few millimeters—the system does not influence the direction of individual flat waves (or beams), but essentially only the phase position of the individual flat waves is manipulated. In contrast the interference effects utilized in accordance with the disclosure, in a conventional liquid lens with a liquid layer of typically a few millimeters, because of the limited coherence length of the light, no longer play any part as the interference effects utilized in accordance with the disclosure and thus phase influencing occur only in the thickness region which is selected in the present case and which is near the wavelength.

Partial reflection phenomena occur at the interfaces in relation to the liquid or gaseous layer portion provided in accordance with the disclosure, wherein ultimately the effect of the layer system is determined by the superimpositioning which takes place in respect of the partial waves occurring in that situation. In that respect use is made of the fact that the action of the layer stack, as an interference phenomenon, is particularly sensitively dependent on the thicknesses of the individual layers. The concept according to the disclosure of providing a liquid or gaseous layer portion, in the case of application to a multilayer system with a multiplicity of partial layers, involves modulating the thickness of one of those partial layers in its thickness configuration, whereby the interference properties are modified.

The layer system is at least one-side bounded by a lens or a mirror, i.e. the layer system is arranged adjacent, at least on one side of the layer system, to a lens or a mirror.

Basically the layer system according to the disclosure provides that, for each of the two parameters intensity I and phase $\phi$, both the averaged value (($I_s+I_p$)/2) and ($\phi_s+\phi_p$)/2)) as well as the separation of intensity ($I_s-I_p$, "diattenuation") or the phase ($\phi_s-\phi_p$) can be influenced.

In that respect the variation in thickness which is caused in the liquid layer portion, depending on the respective specific factors involved, that is to say the structure of the layer system as well as the arrangement thereof within the optical system, can have an effect either on the phase or also on the intensity, with a relatively high degree of sensitivity. In particular the layer design in the layer system according to the disclosure can be so selected that one of the foregoing four parameters (for example phase separation, i.e. the phase difference obtained for orthogonal polarizations states) is influenced in a deliberately specific fashion, with the other parameters remaining at least substantially unchanged.

In particular the layer system according to the disclosure—with the averaged intensity being influenced—can be used as a variable gray filter, for example in the projection objective, the properties of which can be manipulated on a comparatively small time scale.

In certain embodiments, the layer system is at least one-side bounded by a lens and the manipulator has an arrangement of actuators provided at the edge of the lens. In particular the liquid or gaseous layer portion can be arranged between two lenses, wherein at least one of those two lenses is actively deformable. In that case the manipulator can have for example an arrangement of actuators provided at the edge of a lens arranged in adjacent relationship with the layer portion.

In some embodiments, the layer system is at least one-side bounded by a mirror and the manipulator has an arrangement of actuators that is provided on a surface, which is not optically effective, of the mirror (for example the "rear side" of a concave mirror).

The concept according to the disclosure makes it possible to provide for deliberate targeted detuning of the layer system for the correction of a disturbance, which is present elsewhere in the optical system (for example the projection objective) in respect of the desired intensity distribution, insofar as reflection or the action in the transmission mode—depending on the respective arrangement of the layer system on a mirror or a refractive lens—is manipulated in positionally resolved fashion until the desired correction action is achieved, by deliberate targeted deformation of the deformable layer portion.

In addition a change in phase which possibly occurs in an unwanted fashion can be remedied by phase manipulators arranged elsewhere in the optical system so that intensity influencing remains as the sole net effect. Equally polarization separation which possibly occurs in an unwanted fashion can also be compensated by suitable manipulators elsewhere in the optical system.

Phase separation can also be set as a desired effect with the layer system according to the disclosure which includes the deformable layer portion, in order for example to compensate for a disturbance, which occurs elsewhere in the optical system, in polarization distribution (for example as a consequence of holder-induced stress refraction etc.). Influencing the above-described separation parameters (that is to say transmission or phase separation) represents a particularly advantageous use of the disclosure as basically that is relatively difficult to achieve with other approaches.

In certain embodiments, the maximum thickness of the liquid or gaseous layer portion is at a maximum half a working wavelength ($\lambda$) of the optical system. Typical working wavelengths in a microlithographic projection exposure apparatus are less than 250 nm, for example about 193 nm or about 157 nm. In that respect, use is made of the fact that in the thickness range of between zero and $\lambda/2$, basically the entire range of action can be covered by setting a phase in the range of 0°-180°, which can also be covered with somewhat thicker layer systems (for example a layer of a thickness of $3\lambda/2$).

The maximum thickness of the liquid or gaseous layer portion can be in particular in the range of between 10 and 100 nm (e.g., in the range of between 30 and 100 nm, in the range of between 50 and 100 nm).

In some embodiments, the layer system has an alternate succession of layers of a first layer material and a second layer material, wherein the first layer material has a refractive index of less than the refractive index of quartz glass ($SiO_2$) at a working wavelength and the second layer material has a refractive index of greater than the refractive index of quartz glass ($SiO_2$) at the working wavelength. In that respect in accordance with the disclosure it is possible in particular to use layer materials which admittedly are otherwise rather unusual but provide the deformable layer portion or the desired deformability, for example water with n=1.44 at $\lambda$=193 nm or also a suitable gel. It is also possible to use in a liquid layer portion for example the immersion liquids $H_2SO_4$, $H_3PO_4$ and aqueous solutions thereof, as are referred to in US 2006/0221456 A1 (with refractive indices n in the range of 1.5-1.8 at $\lambda$=193 nm and optionally with substitution of deuterium), or cyclohexane (with a refractive index n=1.556 at $\lambda$=193 nm).

In that respect, in the context of layer optimization—which as such can be implemented in conventional manner—it can be predetermined that the respectively desired layer portions including the stated deformable liquid or gaseous layer portion are included in the layer system.

In certain embodiments, a layer portion with particularly advantageous growth or adhesion conditions can be provided in the layer system as the first (growth) layer portion. Furthermore a protective layer affording a particularly good protective action in relation to environmental influences can advantageously be selected as the outermost, uppermost layer portion of the layer stack.

In some embodiments, a change in a reflection capability of the layer system of at least 0.1% (e.g., at least 1%) can be set by a variation in the thickness profile of the first layer for at least one optically useable direction of incidence of light passing through the layer system.

In certain embodiments, a change in a transmission separation of the layer system of at least 0.1% (e.g., at least 1%) can be set by a variation in the thickness profile of the first layer for at least one optically useable direction of incidence of light passing through the layer system.

In some embodiments, a change in a birefringence of the layer system of at least 0.1° (e.g., at least 1°) can be set by a variation in the thickness profile of the first layer for at least one optically useable direction of incidence of light passing through the layer system.

In some embodiments, a change in an absorption capability of the layer system of at least k=0.001/cm (at least k=0.01/cm) can be set by a variation in the thickness profile of the first layer for at least one optically useable direction of incidence of light passing through the layer system.

In some embodiments, a flow movement can be produced or maintained in the liquid or gaseous layer portion in operation of the optical system, whereby it is possible to counteract an unwanted rise in temperature of the respectively adjoining optical element (lens or mirror).

The concept according to the disclosure can equally well be implemented both in the illumination system and also in the projection objective.

The disclosure further concerns an optical element, a method of modifying the imaging properties in an optical system of a microlithographic projection exposure apparatus, a microlithographic projection exposure apparatus, a process for the microlithographic production of microstructured components and a microstructured component.

Further configurations of the disclosure as set forth in the description and the appendant claims.

The disclosure is described in greater detail hereinafter by way of exemplary embodiments aspects of which are illustrated in the accompanying drawings.

DETAILED DESCRIPTION

Figure 1:
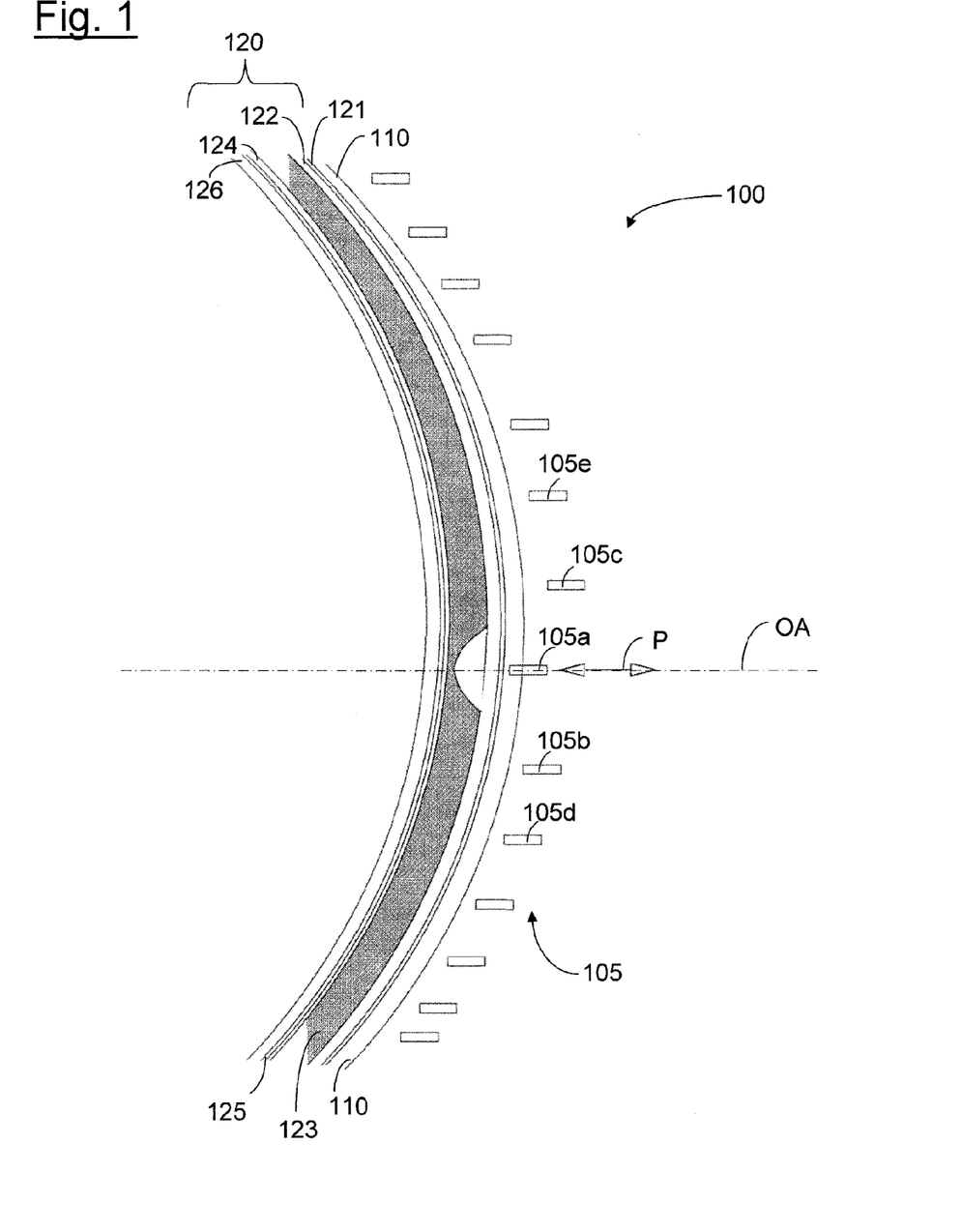
FIG. 1 shows a diagrammatic view of the structure of a layer system.

FIG. 1 shows a diagrammatic view of the structure of a layer system 100.

In FIG. 1, the concept according to the disclosure is implemented on a concave mirror 110, wherein arranged on the rear side of the mirror or the substrate thereof are individual actuators 105a, 105b, 105c, . . . which are actuable independently of each other.

In FIG. 1, starting from the concave mirror 110, individual layer portions 121 through 126 of a layer system 120 occur in succession in a direction towards the left, the layer portion 123 here forming the liquid layer portion 123 according to the disclosure. The layer portions 122 and 124 respectively adjoining that liquid layer portion 123 can if desired additionally be coated at the interface with a membrane or also with a glass plate of small thickness.

It will be appreciated that the disclosure is not limited to a concave mirror so that instead thereof it is also possible to use a flat mirror for the arrangement of the layer portions on that mirror. Corresponding suitable flat mirrors are available both in the illumination system and also in various designs of projection objectives, for example in the RCR design described in fuller detail hereinafter with reference to FIG. 5.

The actuators 105a, 105b, 105c, . . . in their totality thus form a manipulator for manipulation of the thickness profile of the liquid layer portion 123 and can be for example in the form of piezoelectric elements and/or Lorentz motors.

As is shown in FIG. 1 in only diagrammatic and highly exaggerated form, liquid is displaced out of the liquid layer portion 123 for example at the position of the double-headed arrow P by pressure applied by the corresponding manipulator so that the liquid layer portion 123 becomes thinner there and the layer action of the layer system 120 is influenced at that location. In that case the layer portions 124 and 125 arranged on the side of the liquid layer portion 123, that is remote from the concave mirror 110, ideally remain unchanged in their geometry.

It will be appreciated that the illustration of the layer system 120 in FIG. 1 is not true to scale but is greatly exaggerated, in which respect in particular it is also possible to provide a larger or smaller number of layers. Typically the layer system has an alternate succession of layers of a first layer material and layers of a second layer material, wherein the first layer material has refractive index which is less than the refractive index of quartz glass ($SiO_2$) at a working wavelength of the optical system, and the second layer material has a refractive index which is greater than that of quartz glass ($SiO_2$) at the working wavelength.

Suitable layer materials of the "low-refractive" layer portions are for example chiolith (refractive index n=1.38 at λ=193 nm) and magnesium fluoride ($MgF_2$, n(193 nm)=1.42).

Suitable layer materials of the "higher-refractive" layer portions are for example sapphire ($Al_2O_3$, n(193 nm)=1.81) and lanthanum fluoride ($LaF_3$, n(193 nm)=1.70).

A specific embodiment by way of example of a layer system according to the disclosure is set out in Table 1.

TABLE 1

| Layer No | Thickness (nm) | Material | Refractive index (193 nm) | Absorptions coefficient (k) |
|---|---|---|---|---|
| 1 | 70.0 | Aluminum (Al) | 0.1127 | 2.20286 |
| 2 | 19.3 | Chiolith ($Na_5Al_3F_{14}$) | 1.384 | 0.00037 |
| 3 | 84.0 | Water ($H_2O$) | 1.44 | 0 |
| 4 | 14.9 | Aluminum oxide ($Al_2O_3$) | 1.811 | 0.0026 |
| 5 | 43.0 | Chiolith ($Na_5Al_3F_{14}$) | 1.384 | 0.00037 |
| 6 | 25.1 | Aluminum oxide ($Al_2O_3$) | 1.811 | 0.0026 |

Figure 6A:
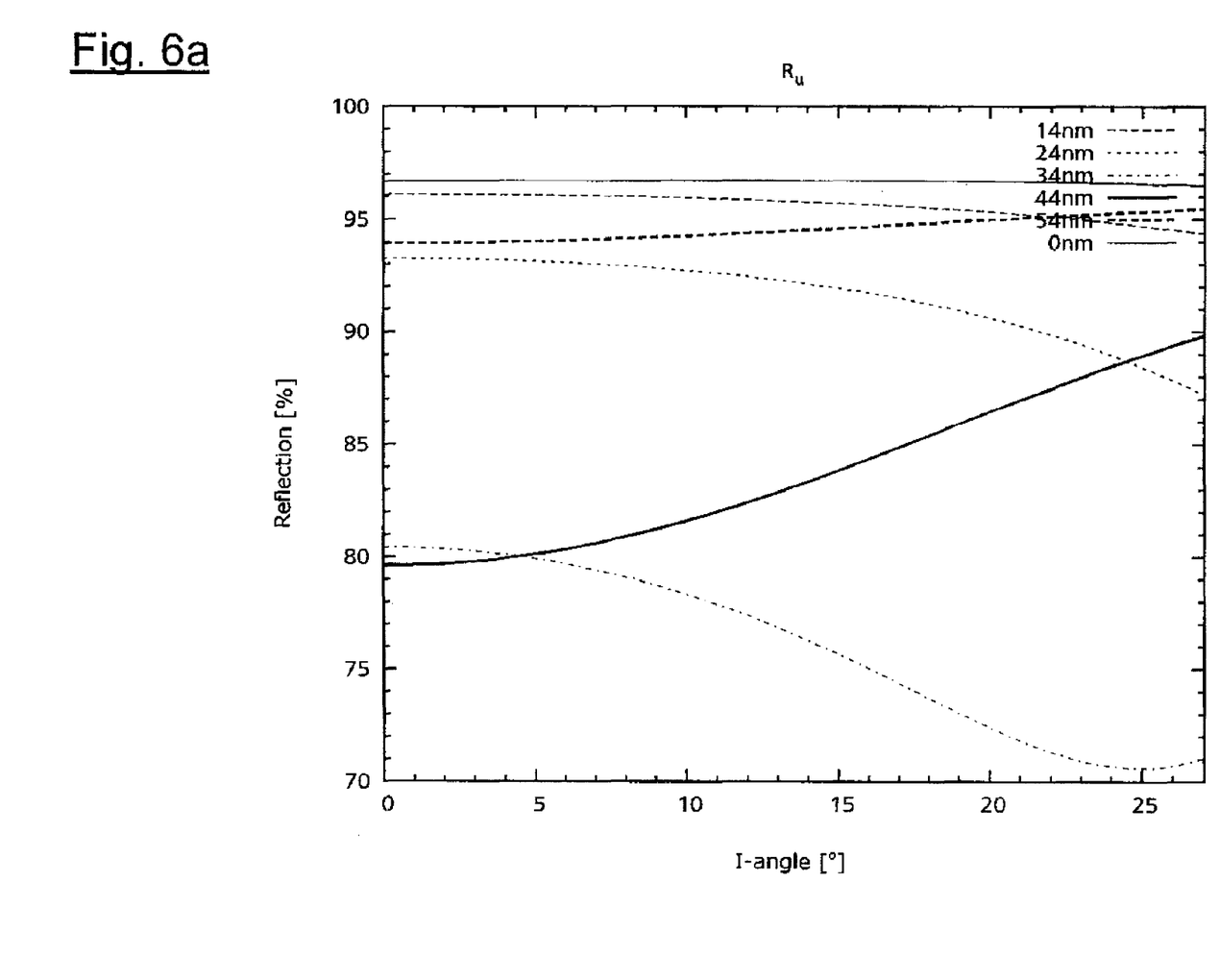
FIGS. 6a-b show the calculated incidence angle dependency of reflection (FIG. 6a) and reflection separation (FIG. 6b) respectively for different reductions in thickness of a liquid layer portion.
Figure 6B:
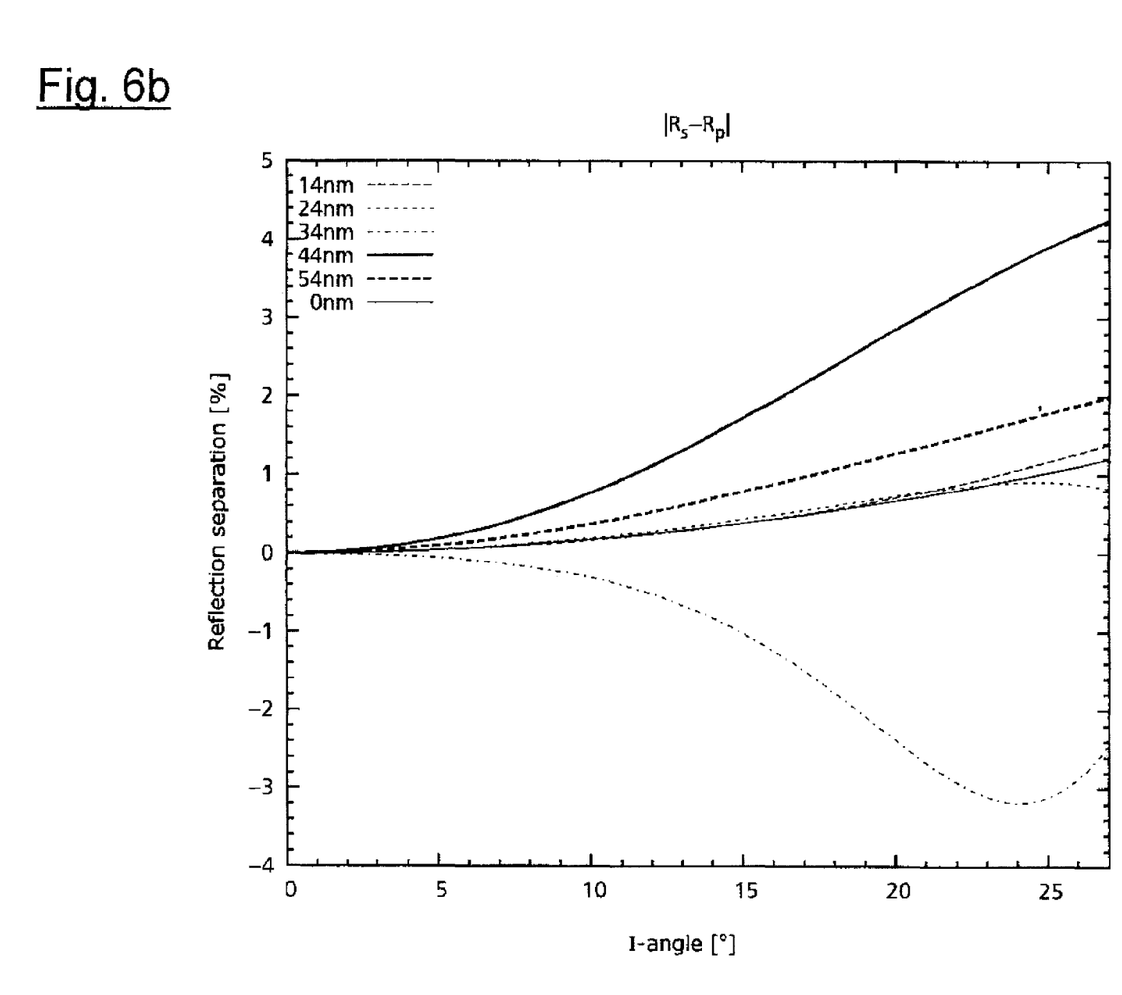

FIG. 6, for the above-indicated layer system and with a variation in the thickness of the liquid layer portion of water, illustrates the calculated incidence angle dependency of reflection (FIG. 6a) and reflection separation (FIG. 6b). In that case the thickness of the liquid layer portion is reduced stepwise with respect to the nominal starting value of 84.0 nm as shown in Table 1, wherein FIG. 6, for the individual curves, specifies the respective reduction in thickness in relation to that starting value (that is to say, there was a reduction in thickness by 0 nm, 14 nm, 24 nm, 34 nm, 44 nm and 54 nm). There is found to be a delicate dependency in respect of the curves on the thickness of the liquid layer, which can thus be suitably selected depending on the respectively desired effect.

The disclosure is not limited to a liquid medium such as for example water in regard to the layer portion which can be manipulated ("tuned") in respect of its thickness profile, but instead it is also possible to use a gaseous medium such as for example air or another gas, wherein in the case of using the disclosure in a projection objective, that gas can in particular also be a flushing gas used in the projection objective (for example a chemically inert gas such as nitrogen ($N_2$), argon (Ar), helium (He) or mixtures thereof.

The use of a gaseous medium such as air in place of a liquid medium can be advantageous in particular in regard to service life of the adjoining optical components or layer portions. Embodiments for layer systems with such a gaseous layer portion are set forth hereinafter in Tables 2 and 3, in each of which an air layer is used in place of a water layer.

TABLE 2

(=Example L1 in FIG. 7):

| Layer No | Thickness (nm) | Material | Refractive index (193 nm) | Absorptions coefficient (k) |
|---|---|---|---|---|
| 1 | 70.0 | Aluminum (Al) | 0.1127 | 2.20286 |
| 2 | 24.4 | Chiolith ($Na_5Al_3F_{14}$) | 1.384 | 0.00037 |
| 3 | 25.8 | Aluminum oxide ($Al_2O_3$) | 1.811 | 0.0026 |
| 4 | 40.8 | Chiolith ($Na_5Al_3F_{14}$) | 1.384 | 0.00037 |
| 5 | 25.8 | Aluminum oxide ($Al_2O_3$) | 1.811 | 0.0026 |
| 6 | 60.3 | Air | 1 | 0 |
| 7 | 24.8 | Aluminum oxide ($Al_2O_3$) | 1.811 | 0.0026 |
| 8 | 39.5 | Chiolith ($Na_5Al_3F_{14}$) | 1.384 | 0.00037 |
| 9 | 23.1 | Aluminum oxide ($Al_2O_3$) | 1.811 | 0.0026 |
| 10 | 44.5 | Chiolith ($Na_5Al_3F_{14}$) | 1.384 | 0.00037 |

TABLE 3

(=Example L2 in FIG. 7):

| Layer No | Thickness (nm) | Material | Refractive index (193 nm) | Absorptions coefficient (k) |
|---|---|---|---|---|
| 1 | 70.0 | Aluminum (Al) | 0.1127 | 2.20286 |
| 2 | 25.5 | Chiolith ($Na_5Al_3F_{14}$) | 1.384 | 0.00037 |
| 3 | 25.5 | Aluminum oxide ($Al_2O_3$) | 1.811 | 0.0026 |
| 4 | 39.9 | Chiolith ($Na_5Al_3F_{14}$) | 1.384 | 0.00037 |
| 5 | 24.8 | Aluminum oxide($Al_2O_3$) | 1.811 | 0.0026 |
| 6 | 51.1 | Air | 1 | 0 |

The layer system in accordance with Table 2, including the layer portion of air, can be implemented in such a way that the layer portions Nos 1-5 are vapor deposited in mutually superposed relationship on a quartz substrate, the layer portions 7-10 are similarly vapor deposited on another quartz substrate, and then the two sub-layer systems formed in that way are arranged at the spacing corresponding to the air layer to be formed, relative to each other. In the layer system of Table 3, unlike the example of Table 2, the "tunable" air layer directly adjoins a quartz substrate so that only one substrate has to be coated, unlike the situation with the example of Table 2.

It will be appreciated that the disclosure is not limited to quartz or quartz glass as a material adjoining the layer system according to the disclosure so that instead it is also possible to use other suitable lens materials such as for example calcium fluoride ($CaF_2$), garnets, in particular lutetium aluminum garnet ($Lu_3Al_5O_{12}$) and yttrium aluminum garnet ($Y_3Al_5O_{12}$) or spinel, in particular magnesium spinel ($MgAl_2O_4$) as materials adjoining the layer system according to the disclosure.

Figure 7:
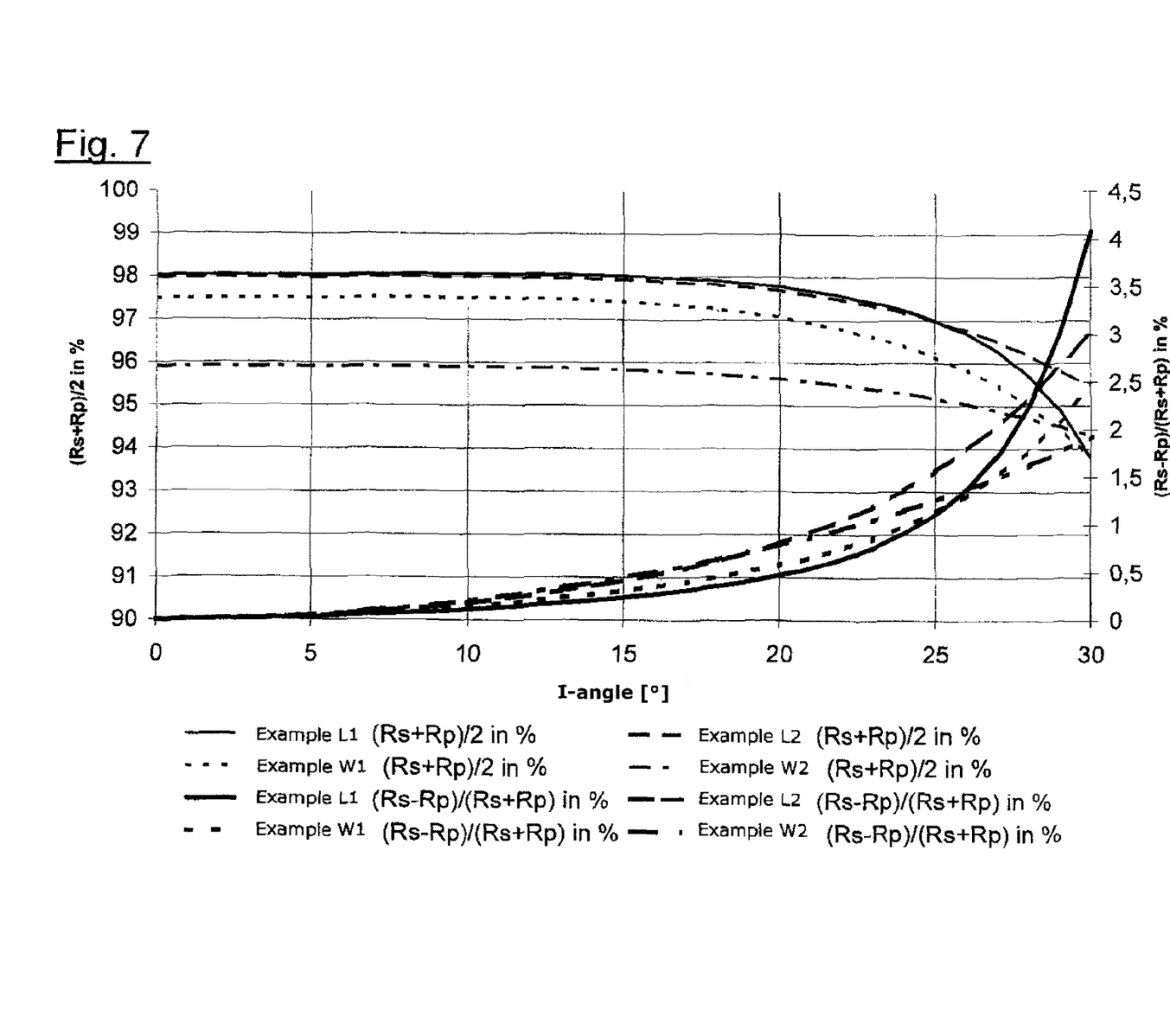
FIG. 7 shows a graph for comparing the degrees of reflection and reflection separation which can be achieved in different layer systems with a water layer and with an air layer respectively.

The following layer systems of Tables 4 and 5 are further embodiments by way of example of layer systems with a liquid layer of water which otherwise involve a respective structure similar to Table 2 and Table 3 respectively. As can be seen from FIG. 7, higher values in respect of the degree of reflection can be achieved when using air instead of water, which can be attributed to the refractive index difference in relation to the adjoining layer portion, which is greater in the case of air. FIG. 7 also shows (being plotted on the right-hand vertical axis in FIG. 7) the value $(R_s-R_p)/(R_s+R_p)$ for the layer systems of Tables 2-5.

TABLE 4

(=Example W1 in FIG. 7):

| Layer No | Thickness (nm) | Material | Refractive index (193 nm) | Absorptions coefficient (k) |
|---|---|---|---|---|
| 1 | 70.0 | Aluminum (Al) | 0.1127 | 2.20286 |
| 2 | 25.6 | Chiolith ($Na_5Al_3F_{14}$) | 1.384 | 0.00037 |
| 3 | 25.5 | Aluminum oxide ($Al_2O_3$) | 1.811 | 0.0026 |
| 4 | 39.7 | Chiolith ($Na_5Al_3F_{14}$) | 1.384 | 0.00037 |
| 5 | 24.8 | Aluminum oxide ($Al_2O_3$) | 1.811 | 0.0026 |
| 6 | 41.5 | Water ($H_2O$) | 1.44 | 0 |
| 7 | 22.6 | Aluminum oxide ($Al_2O_3$) | 1.811 | 0.0026 |
| 8 | 42.7 | Chiolith ($Na_5Al_3F_{14}$) | 1.384 | 0.00037 |
| 9 | 23.0 | Aluminum oxide ($Al_2O_3$) | 1.811 | 0.0026 |
| 10 | 32.1 | Chiolith ($Na_5Al_3F_{14}$) | 1.384 | 0.00037 |

TABLE 5

(=Example W2 in FIG. 7):

| Layer No | Thickness (nm) | Material | Refractive index (193 nm) | Absorptions coefficient (k) |
|---|---|---|---|---|
| 1 | 70.0 | Aluminum (Al) | 0.1127 | 2.20286 |
| 2 | 25.6 | Chiolith ($Na_5Al_3F_{14}$) | 1.384 | 0.00037 |
| 3 | 25.4 | Aluminum oxide ($Al_2O_3$) | 1.811 | 0.0026 |
| 4 | 39.9 | Chiolith ($Na_5Al_3F_{14}$) | 1.384 | 0.00037 |
| 5 | 24.6 | Aluminum oxide ($Al_2O_3$) | 1.811 | 0.0026 |
| 6 | 34.5 | Water ($H_2O$) | 1.44 | 0 |

Figure 2:
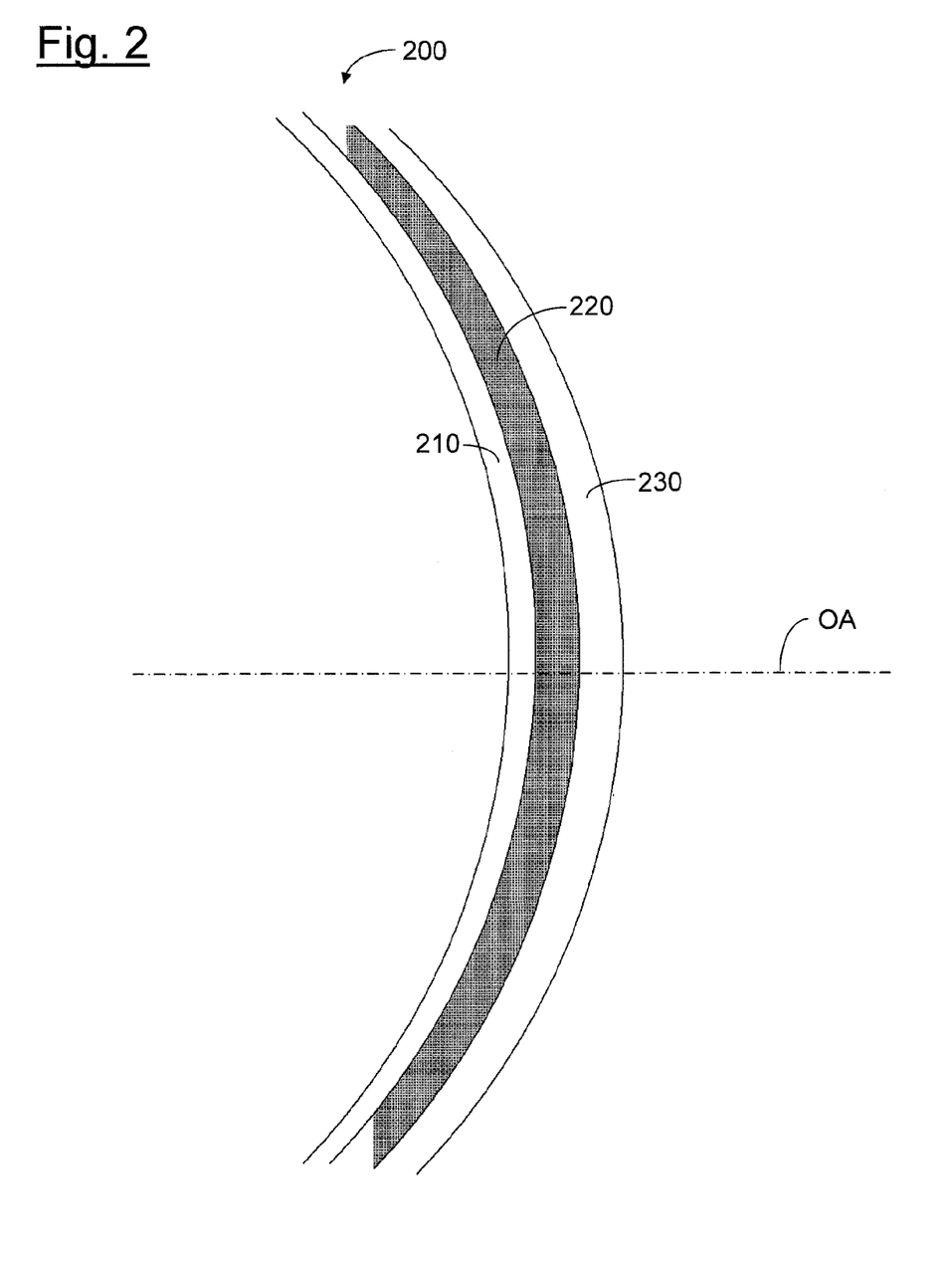
FIG. 2 shows a diagrammatic view of the structure of a layer system.

FIG. 2 is a diagrammatic view showing the structure of a layer system 200, this view also not being true to scale but being greatly exaggerated.

Referring to FIG. 2, what is referred to as a bidirectional active lens element (="BALE") 210, a layer portion 220 according to the disclosure or an interference layer system with a liquid or gaseous layer portion according to the disclosure and a further lens 230 held independently of the lens element 210 are arranged in a condition of bearing flush against each other. The bidirectional active lens element 210 is manipulated in positionally resolved fashion by way of actuators arranged at the edge in basically known manner in respect of its thickness, thereby once again achieving specific desired manipulation of the thickness distribution of the layer portion 220. In an alternative configuration the layer portion 220 can also be arranged between two lens elements which are respectively manipulatable in their thicknesses.

It will be appreciated that the disclosure is not limited to curved lens surfaces so that instead it is also possible to use plane plates for the arrangement of the layer portion according to the disclosure.

Figure 3:
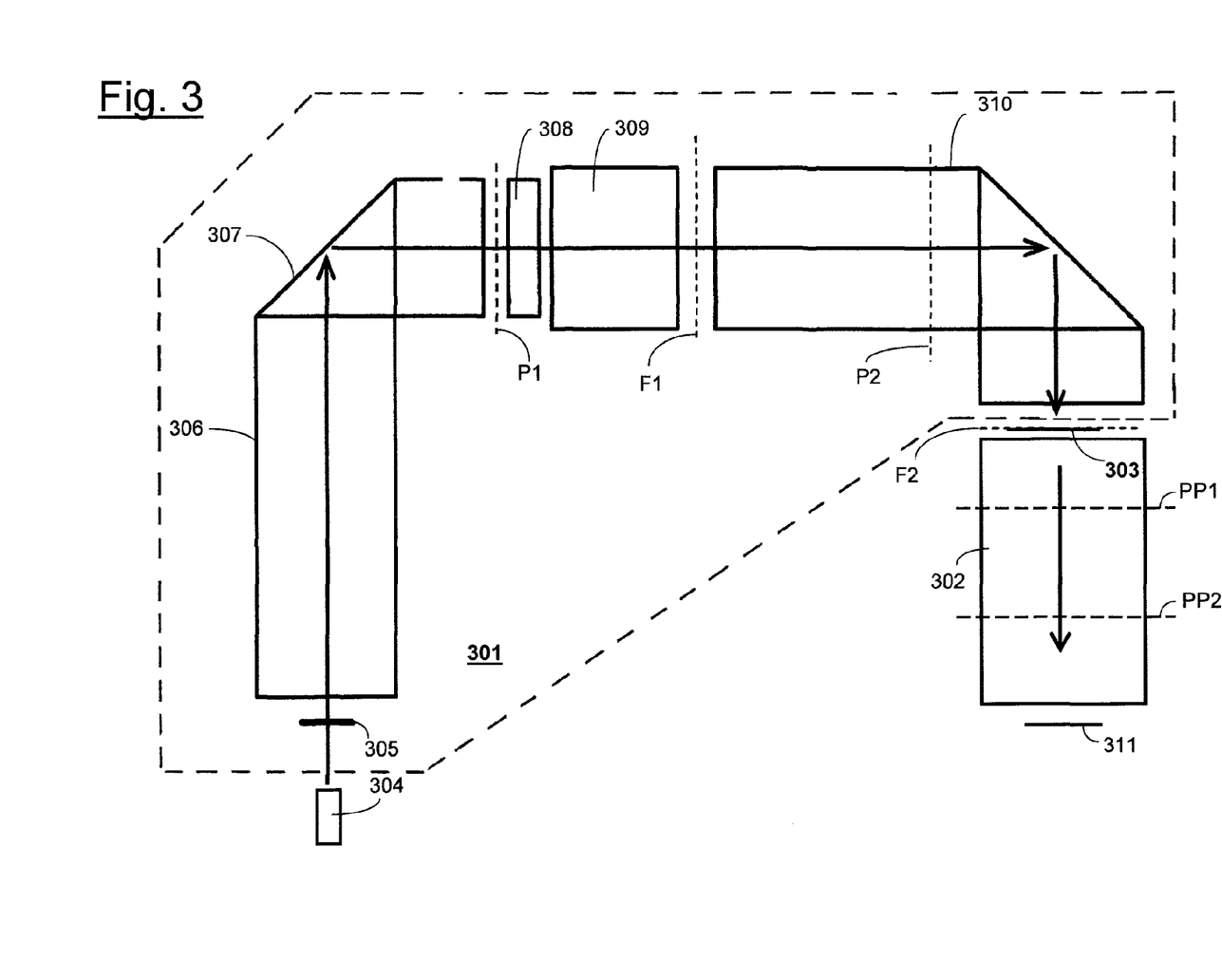
FIG. 3 shows a diagrammatic view of the structure of a microlithographic projection exposure apparatus.

FIG. 3 is an only diagrammatic view showing the structure in principle of a microlithographic projection exposure apparatus. In this case the concept according to the disclosure can be implemented equally both in the illumination system and also in the projection objective.

The microlithographic projection exposure apparatus has an illumination system 301 and a projection objective 302. The illumination system 301 serves for illuminating a structure-bearing mask (reticle) 303 with light from a light source unit 304 which for example includes an ArF laser for a working wavelength of 193 nm as well as a beam shaping optical mechanism for producing a parallel light beam. The parallel light beam of the light source unit 304 is firstly incident on a diffractive optical element 305 (also referred to as a "pupil defining element") which, by way of an angle radiation characteristic defined by the respective diffracting surface structure, produces in the pupil plane P1 a desired intensity distribution (for example dipole or quadrupole distribution). Disposed downstream of the diffractive optical element 305 in the light propagation direction is an optical unit 306 including a zoom objective for producing a parallel light beam of variable diameter, and an axicon lens. Different illumination configurations are produced via the zoom objective in conjunction with the upstream-disposed diffractive optical element 305 in the pupil plane P1 depending on the respective zoom position and the position of the axicon elements. In the illustrated example the optical unit 306 further includes a deflection mirror 307. Disposed downstream of the pupil plane P1 in the light propagation direction is a light mixing device 308 disposed in the beam path and which for example in per se known manner can have an arrangement of microoptical elements that is suitable for achieving a light mixing effect. The light mixing device 308 is followed in the light propagation direction by a lens group 309, downstream of which is disposed a field plane F1 with a reticle masking system (REMA) which is projected by an REMA objective 310 following in the light propagation direction onto the structure-bearing mask (reticle) 303 arranged in the field plane F2, and thereby limits the illuminated region to the reticle. The image of the structure-bearing mask 303 is formed with the projection objective 302 which in the illustrated embodiment has two pupil planes PP1 and PP2 on a substrate 311 or a wafer provided with a light-sensitive layer.

One or more layer systems according to the disclosure can be used in the illumination system 301 and/or the projection objective 302, for example in the proximity of a pupil plane and/or a field plane of the illumination system 301 and/or the projection objective 302 respectively. Depending on the respectively desired effect the layer system according to the disclosure can be used both in field-near relationship, pupil-near relationship and also at an intermediary position. Thus for example in the case of correction to be implemented for a disturbance in intensity and/or polarization distribution, the correction action of the layer system is generally correspondingly better, the better the positioning in question of the layer system used as the correction element, in terms of its arrangement in field-near, pupil-near or intermediary relationship (that is to say for example in respect of the subaperture ratio), corresponds to the corresponding location of the disturbance to be corrected. Ideally, the arrangement of the layer system in dependence on the location to be expected for the defect to be corrected can already be taken into consideration in the design of the optical system.

Figure 4:
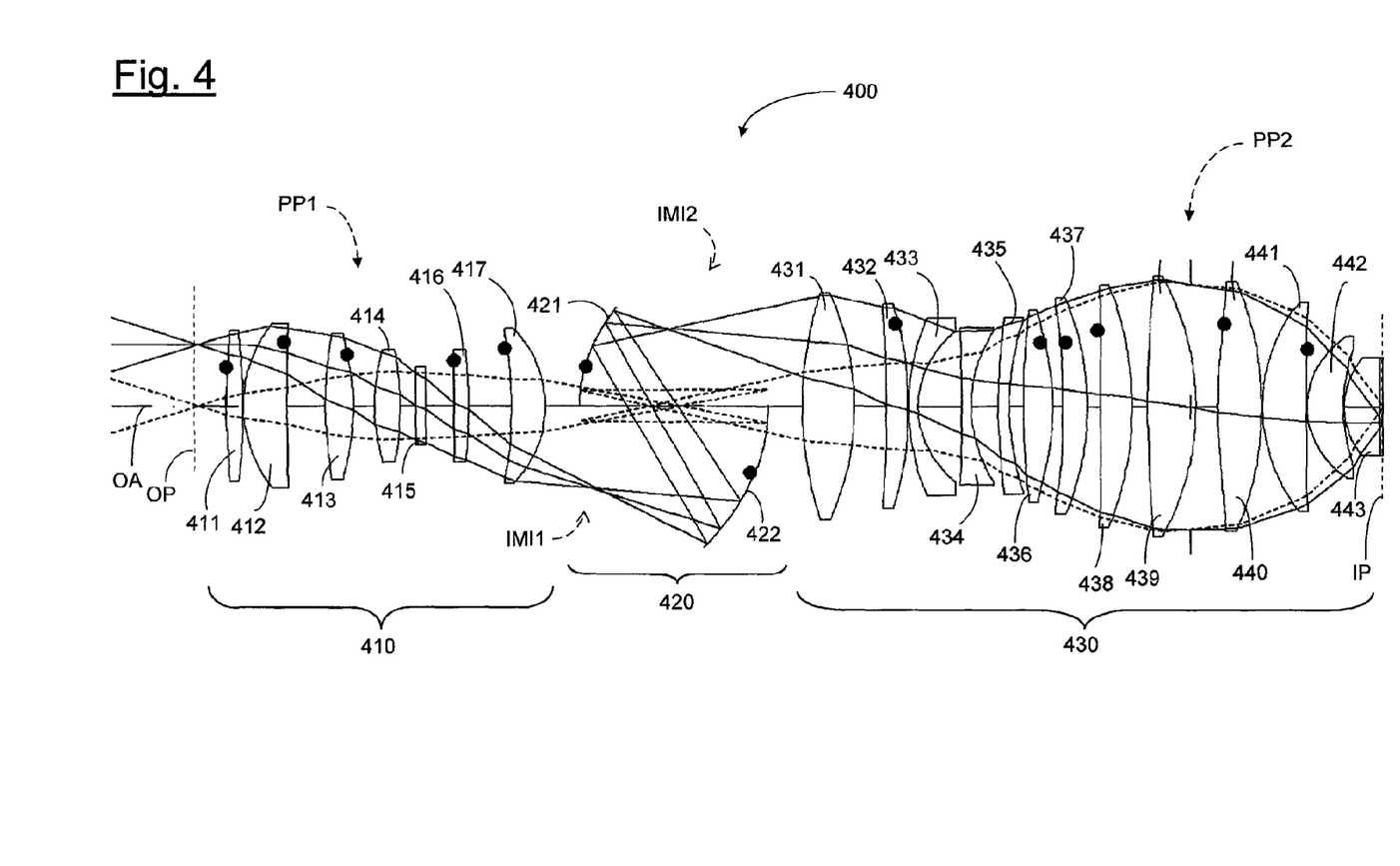
FIGS. 4-5 show an overall meridional cross-section through specific examples of complete catadioptric projection objectives in which a layer system can be embodied.

Referring to FIG. 4 shown therein is a meridional section of a specific projection objective 400. The design data of that projection objective 400 are set out in Table 6. In that respect the number of the respective refractive or otherwise significant optical surface is identified in column 1, the radius of that surface (in mm) is identified in column 2, optionally a reference to an asphere at that surface is identified in column 3, the spacing, referred to as thickness, of that surface in relation to the following surface (in mm) is identified in column 4, the material following the respective surface is identified in column 5 and the optically usable free half-diameter (in mm) of the optical component is identified in column 6.

The aspheric constants are set forth in Table 7. The surfaces which are identified in FIG. 4 with bold dots and specified in Tables 6 and 7 are aspherically curved, wherein the curvature of those surfaces is given by the following aspheric formula:

$$P(h) = \frac{(1/r) \cdot h^2}{1 + \sqrt{1 - (1 + cc)(1/r)^2 h^2}} + C_1 h^4 + C_2 h^6 + \ldots \quad (1)$$

In that formula P is the camber height of the surface in question parallel to the optical axis, h is the radial spacing from the optical axis, r is the radius of curvature of the surface in question, cc is the conic constant (identified in Table 7 by K) and $C_1, C_2, \ldots$ are the aspheric constants set out in Table 7.

As shown in FIG. 4 the projection objective 400 in a catadioptric structure has a first optical subsystem 410, a second optical subsystem 420 and a third optical subsystem 430. In that respect, the term "subsystem" is always used to denote such an arrangement of optical elements, by which a real object is imaged into a real image or an intermediate image. In other words any subsystem, starting from a given object or intermediate image plane, always includes all optical elements as far as the next real image or intermediate image.

The first optical subsystem 410 includes an arrangement of refractive lenses 411-417 and forms the image of the object plane "OP" as a first intermediate image IMI1, the approximate position of which is indicated by an arrow in FIG. 4. That first intermediate image IMI1 is imaged by the second optical subsystem 420 as a second intermediate image IMI2, the approximate position of which is also indicated by an arrow in FIG. 4. The second optical subsystem 420 includes a first concave mirror 421 and a second concave mirror 422 which are each "cut off" in a direction perpendicular to the optical axis in such a way that light propagation can respectively occur from the reflecting surfaces of the concave mirrors 421, 422 towards the image plane "IP". The second intermediate image IMI2 is imaged by the third optical subsystem 430 into the image plane IP. The third optical subsystem 430 includes an arrangement of refractive lenses 431-443.

A layer system according to the disclosure can be arranged in the case of the projection objective 400 of FIG. 4 for example on one of the concave mirrors 421 or 422 or also on both concave mirrors 421 and 422 for example involving the structure shown in FIG. 1.

Figure 5:
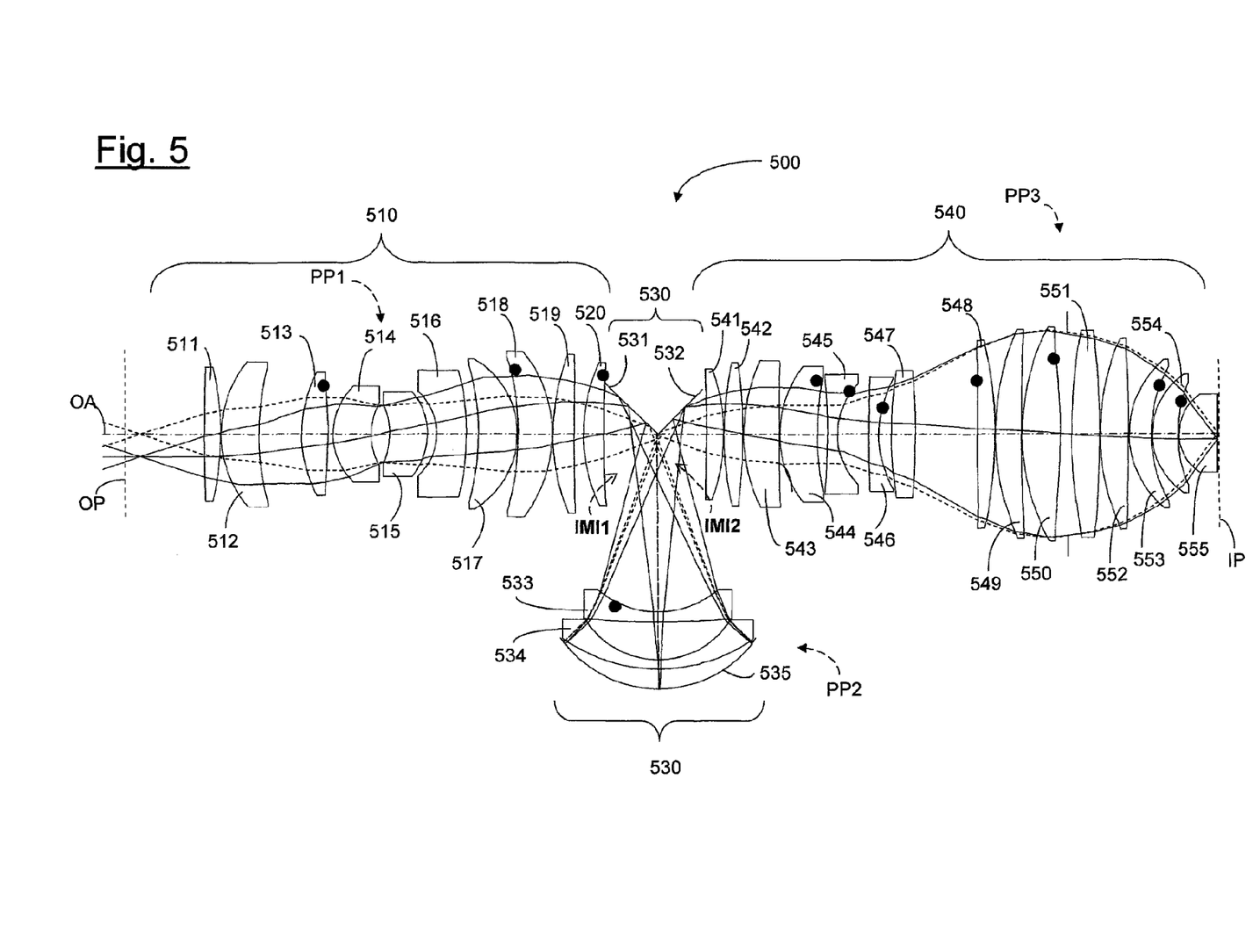

FIG. 5 shows a meridional section of a further specific complete projection objective 500 which is disclosed in WO 2004/019128 A2 (see therein FIG. 19 and Tables 9 and 10). The projection objective 500 includes a first refractive subsystem 510, a second catadioptric subsystem 530 and a third refractive subsystem 540 and is therefore also referred to as a "RCR-system". The first refractive subsystem 510 includes refractive lenses 511 through 520, downstream of which in the beam path a first intermediate image IMI1 is produced. The second subsystem 530 includes a double-folding mirror with two mirror surfaces 531 and 532 which are arranged at an angle relative to each other, wherein light entering from the first subsystem 510 is firstly reflected at the mirror surface 531 in the direction towards the lenses 533 and 534 and a subsequent concave mirror 535. The concave mirror 535 in per se known manner permits effective compensation of the image field curvature produced by the subsystems 510 and 540. The light reflected at the concave mirror 535 is reflected after again passing through the lenses 534 and 533 at the second mirror surface 532 of the double-folding mirror so that the optical axis OA is accordingly folded twice through 90°. The second subsystem 530 produces a second intermediate image IMI2 and the light issuing therefrom impinges on the third refractive subsystem 540 which includes refractive lenses 541 through 555. The second intermediate image IMI2 is reproduced on the image plane IP by the third refractive subsystem 540.

A layer system according to the disclosure can be arranged in the case of the projection objective 500 of FIG. 5 for example on the concave mirror 535 and/or on the flat mirror surface or surfaces 531 and/or 532, once again for example involving the structure shown in FIG. 1.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the present disclosure and the scope of the disclosure is limited only in the sense of the accompanying claims and equivalents thereof.

TABLE 6

(DESIGN DATA FOR FIG. 4):

| Surface | Radius | Asphere | Thickness | Material | Half-diameter |
|---|---|---|---|---|---|
| 1 | 0.000000 | | −0.011620 | LV193975 | 75.462 |
| 2 | 585.070331 | AS | 17.118596 | SIO2V | 76.447 |
| 3 | −766.901651 | | 0.890161 | HEV19397 | 78.252 |
| 4 | 145.560665 | | 45.675278 | SIO2V | 85.645 |
| 5 | 2818.543789 | AS | 40.269525 | HEV19397 | 83.237 |
| 6 | 469.396236 | | 29.972759 | SIO2V | 75.894 |
| 7 | −193.297708 | AS | 21.997025 | HEV19397 | 73.717 |
| 8 | 222.509238 | | 27.666963 | SIO2V | 57.818 |
| 9 | −274.231957 | | 31.483375 | HEV19397 | 52.595 |
| 10 | 0.000000 | | 10.117766 | SIO2V | 44.115 |
| 11 | 0.000000 | | 15.361487 | HEV19397 | 47.050 |
| 12 | 26971.109897 | AS | 14.803554 | SIO2V | 54.127 |
| 13 | −562.070426 | | 45.416373 | HEV19397 | 58.058 |
| 14 | −510.104298 | AS | 35.926312 | SIO2V | 76.585 |
| 15 | −118.683707 | | 36.432152 | HEV19397 | 80.636 |
| 16 | 0.000000 | | 199.241665 | HEV19397 | 86.561 |
| 17 | −181.080772 | AS | −199.241665 | REFL | 147.684 |
| 18 | 153.434246 | AS | 199.241665 | REFL | 102.596 |
| 19 | 0.000000 | | 36.432584 | HEV19397 | 105.850 |
| 20 | 408.244008 | | 54.279598 | SIO2V | 118.053 |
| 21 | −296.362521 | | 34.669451 | HEV19397 | 118.398 |
| 22 | −1378.452784 | | 22.782283 | SIO2V | 106.566 |
| 23 | −533.252331 | AS | 0.892985 | HEV19397 | 105.292 |
| 24 | 247.380841 | | 9.992727 | SIO2V | 92.481 |
| 25 | 103.088603 | | 45.957039 | HEV19397 | 80.536 |
| 26 | −1832.351074 | | 9.992069 | SIO2V | 80.563 |

TABLE 6-continued (DESIGN DATA FOR FIG. 4):

| Surface | Radius | Asphere | Thickness | Material | Half-diameter |
|---|---|---|---|---|---|
| 27 | 151.452362 | | 28.883857 | HEV19397 | 81.238 |
| 28 | 693.739003 | | 11.559320 | SIO2V | 86.714 |
| 29 | 303.301679 | | 15.104783 | HEV19397 | 91.779 |
| 30 | 1016.426625 | | 30.905849 | SIO2V | 95.900 |
| 31 | −258.080954 | AS | 10.647394 | HEV19397 | 99.790 |
| 32 | −1386.614747 | AS | 24.903261 | SIO2V | 108.140 |
| 33 | −305.810572 | | 14.249112 | HEV19397 | 112.465 |
| 34 | −11755.656826 | AS | 32.472684 | SIO2V | 124.075 |
| 35 | −359.229865 | | 16.650084 | HEV19397 | 126.831 |
| 36 | 1581.896158 | | 51.095339 | SIO2V | 135.151 |
| 37 | −290.829022 | | −5.686977 | HEV19397 | 136.116 |
| 38 | 0.000000 | | 0.000000 | HEV19397 | 131.224 |
| 39 | 0.000000 | | 28.354383 | HEV19397 | 131.224 |
| 40 | 524.037274 | AS | 45.835992 | SIO2V | 130.144 |
| 41 | −348.286331 | | 0.878010 | HEV19397 | 129.553 |
| 42 | 184.730622 | | 45.614622 | SIO2V | 108.838 |
| 43 | 2501.302312 | AS | 0.854125 | HEV19397 | 103.388 |
| 44 | 89.832394 | | 38.416586 | SIO2V | 73.676 |
| 45 | 209.429378 | | 0.697559 | HEV19397 | 63.921 |
| 46 | 83.525032 | | 37.916651 | CAF2V193 | 50.040 |
| 47 | 0.000000 | | 0.300000 | SIO2V | 21.480 |
| 48 | 0.000000 | | 0.000000 | SIO2V | 21.116 |
| 49 | 0.000000 | | 3.000000 | H2OV193B | 21.116 |
| 50 | 0.000000 | | 0.000000 | AIR | 16.500 |

TABLE 7

(ASPHERIC CONSTANTS for FIG. 4):

| | 2 | 5 | 7 | 12 | 14 |
|---|---|---|---|---|---|
| K | 0 | 0 | 0 | 0 | 0 |
| C1 | −5.72E−02 | −4.71E−02 | 1.75E−01 | −8.29E−02 | −4.35E−02 |
| C2 | −2.97E−07 | 7.04E−06 | −1.17E−05 | −1.87E−07 | 1.59E−06 |
| C3 | 1.03E−12 | 1.09E−10 | 1.34E−09 | −7.04E−10 | −6.81E−11 |
| C4 | 2.76E−14 | −2.90E−14 | −5.44E−14 | 6.65E−14 | 5.03E−15 |
| C5 | −1.51E−18 | −1.55E−21 | −1.82E−18 | −1.33E−17 | −1.68E−23 |
| C6 | −1.04E−24 | 5.61E−23 | 2.56E−22 | 2.46E−21 | −2.36E−23 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | 17 | 18 | 23 | 31 | 32 |
|---|---|---|---|---|---|
| K | −197.849 | −204.054 | 0 | 0 | 0 |
| C1 | −2.94E−02 | 5.77E−02 | −7.06E−02 | 3.41E−02 | −4.85E−02 |
| C2 | 2.63E−07 | −5.00E−07 | 4.11E−06 | 4.07E−08 | 9.88E−07 |
| C3 | −6.11E−12 | 2.67E−11 | −1.18E−10 | 8.10E−11 | 7.37E−11 |
| C4 | 1.11E−16 | −5.69E−16 | 2.92E−15 | −4.34E−15 | −6.56E−15 |
| C5 | −2.01E−21 | 1.89E−20 | −3.23E−20 | 7.59E−19 | 6.53E−19 |
| C6 | 2.08E−26 | −1.49E−25 | 2.18E−25 | −3.41E−23 | −2.88E−23 |
| C7 | 0.000000e+00 | 0.000000e+00 | 0.000000e+00 | 0.000000e+00 | 0.000000e+00 |
| C8 | 0.000000e+00 | 0.000000e+00 | 0.000000e+00 | 0.000000e+00 | 0.000000e+00 |
| C9 | 0.000000e+00 | 0.000000e+00 | 0.000000e+00 | 0.000000e+00 | 0.000000e+00 |

| | 34 | 40 | 43 |
|---|---|---|---|
| K | 0 | 0 | 0 |
| C1 | 1.59E−02 | −4.10E−02 | −3.89E−02 |
| C2 | −1.51E−06 | 3.04E−07 | 4.76E−06 |
| C3 | 6.62E−13 | 5.71E−11 | −2.23E−10 |
| C4 | 1.72E−15 | −1.72E−15 | 8.89E−15 |
| C5 | −9.36E−20 | −9.60E−22 | −2.41E−19 |
| C6 | 2.36E−24 | 3.81E−25 | 3.43E−24 |
| C7 | 0.000000e+00 | 0.000000e+00 | 0.000000e+00 |
| C8 | 0.000000e+00 | 0.000000e+00 | 0.000000e+00 |
| C9 | 0.000000e+00 | 0.000000e+00 | 0.000000e+00 |

What is claimed is:

1. An article, comprising:
    an optical element selected from the group consisting of a lens and a mirror; and
    an interference layer system bounded by the optical element,
    wherein the interference layer system comprises a plurality of layers including a first layer comprising a liquid or a gas, a maximum thickness of the first layer is at most one micrometer, and a thickness profile of the first layer is manipulatable, and
    wherein, during use of the article in a microlithographic projection exposure apparatus, the thickness profile of the first layer is adjustable in dependence on a polarization distribution currently measured in a predetermined plane of the projection exposure apparatus.

2. An article as set forth in claim 1, wherein the maximum thickness of the first layer is at most 500 nanometers.

3. An article as set forth in claim 1, wherein the maximum thickness of the first layer is at most half of a working wavelength of the optical system.

4. An article as set forth in claim 1, wherein the maximum thickness of the first layer is in the range of between 10 nm and 100 nm.

5. An article as set forth in claim 1, wherein the first layer comprises water or at least one gas selected from the group consisting of air, nitrogen ($N_2$), argon (Ar), and helium (He).

6. An article as set forth in claim 1, wherein the optical element is a mirror, the manipulator comprises an arrangement of actuators that is provided on a surface of the mirror, and the surface of the mirror not being optically effective.

7. An article as set forth in claim 1, wherein the optical element is a lens, and the manipulator comprises an arrangement of actuators provided at an edge of the lens.

8. An article as set forth in claim 1, wherein the interference layer system comprises an alternate succession of layers comprising a first material and layers comprising a second material, wherein the first material has a refractive index that is smaller than a refractive index of quartz glass ($SiO_2$) at a working wavelength of the optical system, and the second material has a refractive index that is greater than the refractive index of quartz glass ($SiO_2$) at the working wavelength.

9. An apparatus, comprising:
    an illumination system; and
    a projection objective,
    wherein at least one member selected from the group consisting of the illumination system and the projection objective comprises:
        an optical element selected from the group consisting of a lens and a mirror;
        an interference layer system bounded by the optical element, the interference layer system comprising a plurality of layers including a first layer having a maximum thickness of at most one micrometer, the first layer comprising a liquid or a gas; and
        a manipulator configured to manipulate a thickness profile of the first layer,
    wherein the apparatus is a microlithographic projection exposure apparatus, and
    wherein, during use of the apparatus, manipulation of the thickness profile of the first layer is adjustable in dependence on a polarization distribution currently measured in a predetermined plane of the apparatus.

10. An apparatus as set forth in claim 9, wherein the maximum thickness of the first layer is at most 500 nanometers.

11. An apparatus as set forth in claim 9, wherein the maximum thickness of the first layer is at most half of a working wavelength of the optical system.

12. An apparatus as set forth in claim 9, wherein the maximum thickness of the first layer is in the range of between 10 nm and 100 nm.

13. An apparatus as set forth in claim 9, wherein the interference layer system comprises an alternate succession of layers comprising a first material and layers comprising a second material, wherein the first material has a refractive index that is smaller than a refractive index of quartz glass ($SiO_2$) at a working wavelength of the optical system, and the second material has a refractive index that is greater than the refractive index of quartz glass ($SiO_2$) at the working wavelength.

14. An apparatus as set forth in claim 9, wherein the first layer comprises water or at least one gas selected from the group consisting of air, nitrogen ($N_2$), argon (Ar), and helium (He).

15. An apparatus as set forth in claim 9, wherein the optical element is a mirror, the manipulator comprises an arrangement of actuators that is provided on a surface of the mirror, and the surface of the mirror not being optically effective.

16. An apparatus as set forth in claim 9, wherein the optical element is a lens, and the manipulator comprises an arrangement of actuators provided at an edge of the lens.

17. An optical system, comprising:
    an optical element selected from the group consisting of a lens and a mirror;
    an interference layer system bounded by the optical element, the interference layer system comprising a plurality of layers including a first layer having a maximum thickness of at most one micrometer, the first layer comprising a liquid or a gas; and
    a manipulator configured to manipulate a thickness profile of the first layer,
    wherein the optical system is configured to be used in a microlithographic projection exposure apparatus; and
    wherein, during use of the optical system, manipulation of the thickness profile of the first layer is adjustable in dependence on a polarization distribution currently measured in a predetermined plane of the optical system.

18. An optical system as set forth in claim 17, wherein the maximum thickness of the first layer is at most 500 nanometers.

19. An optical system as set forth in claim 17, wherein the maximum thickness of the first layer is at most half of a working wavelength of the optical system.

20. An optical system as set forth in claim 17, wherein the maximum thickness of the first layer is in the range of between 10 nm and 100 nm.

21. An optical system as set forth in claim 17, wherein the interference layer system comprises an alternate succession of layers comprising a first material and layers comprising a second material, wherein the first material has a refractive index that is smaller than a refractive index of quartz glass ($SiO_2$) at a working wavelength of the optical system, and the second material has a refractive index that is greater than the refractive index of quartz glass ($SiO_2$) at the working wavelength.

22. An optical system as set forth in claim 17, wherein the first layer comprises water or at least one gas selected from the group consisting of air, nitrogen (N2), argon (Ar), and helium (He).

23. An optical system as set forth in claim 17, wherein the optical element is a mirror, the manipulator comprises an arrangement of actuators that is provided on a surface of the mirror, and the surface of the mirror not being optically effective.

24. An optical system as set forth in claim 17, wherein the optical element is a lens, and the manipulator comprises an arrangement of actuators provided at an edge of the lens.

* * * * *

UNITED STATES PATENT AND TRADEMARK OFFICE
CERTIFICATE OF CORRECTION

PATENT NO. : 8,294,991 B2  
APPLICATION NO. : 12/687299  
DATED : October 23, 2012  
INVENTOR(S) : Ralf Mueller et al.

Page 1 of 1

It is certified that error appears in the above-identified patent and that said Letters Patent is hereby corrected as shown below:

On the Title page, line 2, Item (54), and column 1, line 2, delete "MICROLITHGRAPHIC" insert --MICROLITHOGRAPHIC--;

Column 9, line 53, delete "=" insert --+--.

Signed and Sealed this  
Twenty-second Day of January, 2013

David J. Kappos  
*Director of the United States Patent and Trademark Office*